United States Patent [19]

Renfro et al.

[11] Patent Number: 5,345,110
[45] Date of Patent: Sep. 6, 1994

[54] LOW-POWER FUSE DETECT AND LATCH CIRCUIT

[75] Inventors: Steve G. Renfro; Gary R. Gilliam, both of Boise, Id.

[73] Assignee: Micron Semiconductor, Inc., Boise, Id.

[21] Appl. No.: 46,541

[22] Filed: Apr. 13, 1993

[51] Int. Cl.⁵ .......................................... H03K 19/007
[52] U.S. Cl. .............................. 307/272.3; 307/202.1; 307/442; 307/247.1; 307/304
[58] Field of Search ............... 307/202.1, 272.3, 272.1, 307/441, 362, 442, 247.1, 304; 365/200, 201

[56] References Cited

U.S. PATENT DOCUMENTS

| | | | |
|---|---|---|---|
| 4,138,613 | 2/1979 | Tanaka | 307/272.3 |
| 4,730,129 | 3/1988 | Kunitoki et al. | 307/202.1 |
| 4,879,690 | 11/1989 | Anami et al. | 365/201 |
| 4,935,899 | 6/1990 | Morigami | 365/200 |
| 5,177,375 | 1/1993 | Ogawa et al. | 307/272.3 |

Primary Examiner—Timothy P. Callahan
Assistant Examiner—Terry L. Englund
Attorney, Agent, or Firm—Angus C. Fox, III

[57] ABSTRACT

This invention is a low-power circuit for detecting and latching the state of a fusible link. During a power-up sequence, the circuit makes a one time determination regarding the blown or unblown status of a fuse element. In one embodiment of the invention, the circuit comprises a fuse detect node which is coupled to power supply voltage ($V_{cc}$) through a first IGFET and to ground through a second IGFET (which, in this embodiment, has more drive than the first) and the fuse element, respectively, when the fuse element is not severed. In another embodiment of the invention, the fuse detect node is coupled to ground through the second IGFET, and to power supply voltage ($V_{cc}$) through the first IGFET (which, in this embodiment, has more drive than the second) and the fuse element, respectively, when the fuse element is not severed. During a first portion of the power-up sequence, both first and second IGFETs are rendered conductive, thus allowing the fuse detect node to reach equilibrium with respect to charge. The equilibrium charge state will depend on whether or not the fuse is severed or intact, and this charge state is reflected in a latched output. Once the output has been latched, whether in a low or high state, the first and second MOSFETs are rendered nonconductive during a second portion of the power-up sequence, thus isolating the fuse detect node from $V_{cc}$ and ground. The output is used to select or deselect a feature option or redundant circuit element.

20 Claims, 4 Drawing Sheets

LOW-POWER FUSE DETECT AND LATCH CIRCUIT

FIELD OF THE INVENTION

This invention relates to the manufacture of integrated circuits and, more particularly, to methods for enhancing the reliability of laser-blown fuses that are currently used both to customize the circuit by activating one of a number of unique circuit elements, and to substitute redundant elements of a circuit array for defective elements.

BACKGROUND OF THE INVENTION

In integrated circuits, there is often a need for discretionary connections which, once established, are permanent. Such discretionary connections are useful, for example, to program read-only memories, for swapping redundant circuit elements for defective circuit elements in memory arrays, for selecting useful circuits in wafer scale integration, and for enabling features or disabling features in integrated circuits. Most often, discretionary connections are made with either fusible links or antifusible links.

An antifusible link, when fabricated, provides an open connection. Antifuse links consist of two conductor and/or semiconductor materials having some kind of a dielectric or insulating material between them. A silicon nitride dielectric layer interposed between two conductively-doped silicon conductors is one common type of antifuse. During programming, selected antifuse links are shorted to provide a closed connection by applying a voltage across the dielectric layer that exceeds its breakdown voltage.

A fusible link, on the other hand, provides a closed connection when fabricated. The fusible link may be selectively melted to provide an open connection. In some cases, the fusible link is melted by passing an electric current through it which is of sufficient magnitude to cause the element to melt. In other cases, a laser beam is used to melt the link.

The use of laser-blown fuses poses several problems. Not infrequently, the blowing of a fusible link does not result in an adequate disconnection between two fuse-linked nodes. This problem may be the result of several factors. First, dielectric layers, which are often deposited on top of the fusible elements are not uniformly thick from wafer to wafer. Even on the same wafer, dielectric layer thickness may vary from the edge to the center. Therefore, the energy required to cleanly sever a fusible element may vary from device (also referred to as a die or chip) to device. If a fusible element is not cleanly blown such that a path of acceptably high resistance exists between the formerly interconnected nodes, it is generally advisable to discard the device, as it is usually undesirable to blow a fuse more than once in the same location. In any case, a relatively large gap must be blown in the link in order to prevent it from later becoming closed during operation of the device, through transmigration of conducting material near the gap into the gap region. This phenomenon of a blown fuse element "healing" itself is more likely to occur under conditions of high voltage and elevated temperature. The phenomenon is particularly problematic, because parts that are deemed to be good during testing immediately following manufacture may degrade in the field to the point where the selected option or replaced redundant circuit element is no longer selected consistently. Once the part becomes unreliable, it must be replaced. It is a generally accepted maxim that the more current that passes through a fusible link, the greater the likelihood of a future transmigration-induced failure.

Fuse circuits, such as the one depicted in FIG. 1 have been commonly used to make discretionary, permanent connections in integrated circuits. For example, such a circuit may be used to effect repairs in VLSI and ULSI random access memory (DRAM) arrays. In such a case, repairs are performed by disabling defective array elements (i.e., one or more rows and/or columns) and enabling functional redundant array elements in such a way that the enabled array element will be addressed in lieu of the disabled array elements. The fuse circuit is replicated many times within the array, with each circuit being associated with a group of rows or a group of columns, rather than with a single row or a single column. Such an arrangement represents a compromise between the competing goals of minimizing circuit space dedicated to repair circuitry and the ability to repair the maximum number of integrated circuit devices.

Still referring to FIG. 1, when the group of array elements associated with an individual repair circuit are fully functional, node A is maintained at ground potential (typically referred to as $V_{ss}$) through the unblown fuse element FE. The output of the repair circuit in such a case is high. However, if one or more of the array elements associated with the repair circuit are determined to be defective during testing, fuse element FE is blown with a laser pulse in order to isolate node A from ground. Device Q1 then pulls node A to near power supply voltage (typically referred to as $V_{cc}$), with the result that the output of the circuit is, now, low. The output feedback path P1 then latches transistor Q2 to an "on" state, thus ensuring that node A is held near $V_{cc}$. The output signal, when low, enables address rerouting for the defective group of circuit elements.

Still referring to FIG. 1, if fuse FE is not completely blown, or if the open circuit partially "heals" itself, a leakage path through fuse element FE will exist. Node A will no longer be maintained near $V_{cc}$, but rather at some voltage between ground and $V_{cc}$. As a consequence, the circuit will be either unstable or completely nonfunctional. The problem will be particularly acute for low $V_{cc}$ levels, since transistor Q1 will not have sufficient drive to compensate for the leakage through fuse FE.

SUMMARY OF THE INVENTION

The problems associated with the use of conventional fuse circuits in integrated circuits are either mitigated or entirely solved by the present invention, which is a low-power circuit for detecting and latching the state of a fuse element. The circuit is advantageous over the prior art in that a one time determination, regarding the blown or unblown status of a fuse element, is made during a power-up sequence. During this power-up sequence, the fuse element is isolated from the power supply voltage so that current no longer flows through the fuse element, even if incompletely blown. This isolation continues until the part is powered down. Thus, transmigration has a very little opportunity to "heal" the fuse element.

In a first embodiment of the invention, the circuit comprises a fuse detect node which is coupled to power supply voltage ($V_{cc}$) through a first transistor and to ground through a second transistor and the fuse element, respectively, when the fuse element is unsevered. For this embodiment of the invention, the drive of the second transistor is preferably greater than or equal to that of the first transistor. In a second embodiment of the invention, the fuse detect node is coupled to ground through the second transistor, and to power supply voltage ($V_{cc}$) through the first transistor and the fuse element, respectively, when the element is unsevered. For this embodiment of the invention, the drive of the first transistor is preferably greater than or equal to that of the second transistor. For both embodiments, the fuse detect node is also coupled to an output node via a latch circuit. During a first portion of the power-up sequence, both first and second transistors are rendered conductive, thus allowing the fuse detect node to reach equilibrium with respect to charge. The equilibrium charge state will depend on whether or not the fuse is severed or intact, and this charge state is reflected in a latched output. For a given fuse status, the charge state will be reversed for the first and second embodiments. Once the output has been latched, whether in a low or high state, the first and second transistors are rendered nonconductive during a second portion of the power-up sequence, thus isolating the fuse detect node from $V_{cc}$ and ground. The output is used to select or deselect a feature option or redundant circuit element.

DETAILED DESCRIPTION OF THE INVENTION

Figure 1:
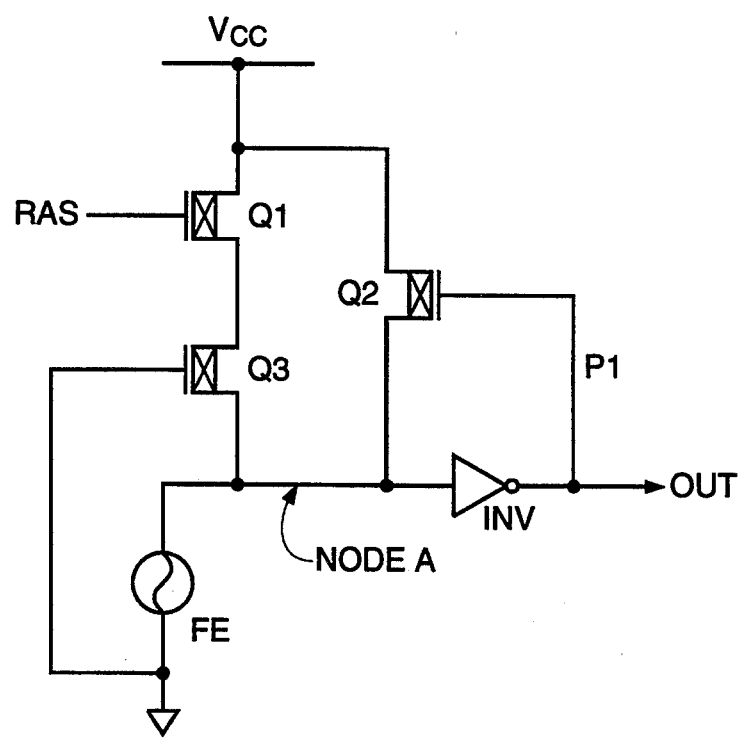
FIG. 1 is a circuit diagram of a typical, prior art repair circuit.
Figure 2:
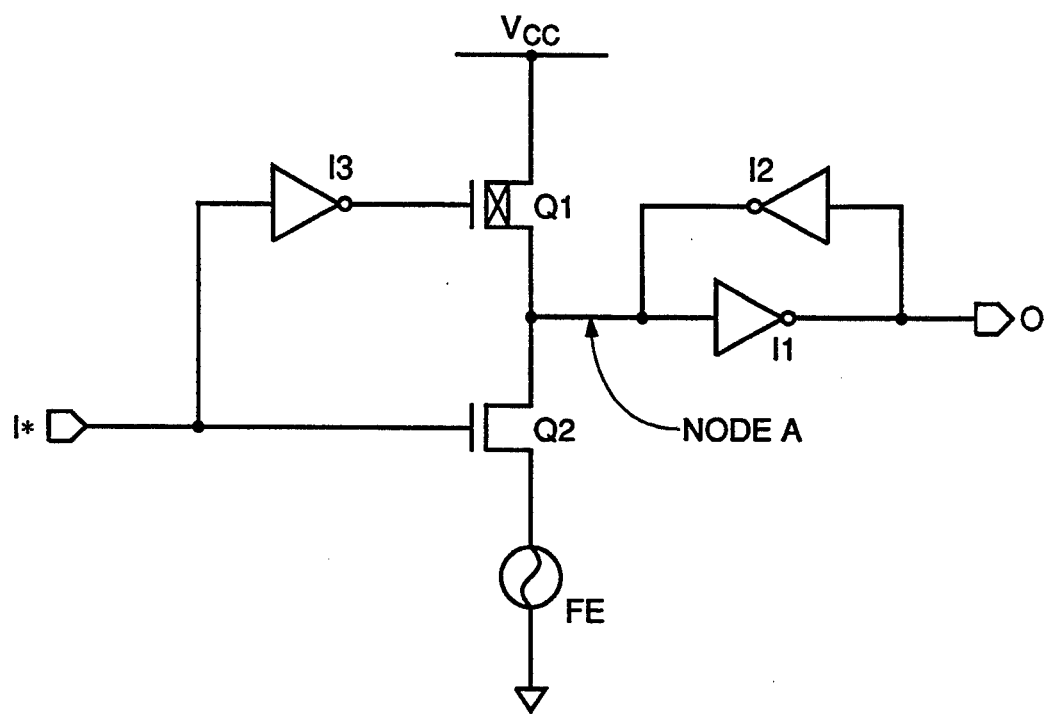
FIG. 2 is an abbreviated circuit diagram of a first embodiment of the new, low-power fuse detect and latch circuit.

Referring now to FIG. 2, which is a first embodiment of the low-power fuse detect and latch circuit, an isolable fuse detect node A is coupled to a power supply voltage ($V_{cc}$) rail through a first insulated gate field effect transistor (IGFET) Q1 and to a ground rail through a second IGFET Q2 and fuse element FE, respectively, when fuse element FE is unblown.

It should be noted that for the embodiment of FIG. 2, IGFET Q1 is shown as being a P-channel device, while IGFET Q2 is shown as being an N-channel device. By placing a P-channel device between the $V_{cc}$ rail and a node at a lower voltage, a phenomenon of increased threshold voltage, known as the "body effect", is avoided in cases where a negatively-biased substrate is used. Negatively biased substrates are commonly used in MOS random access memories in order to improve the performance of the circuitry. The applied negative voltage, generally about minus 3.5 volts with respect to ground, lowers the junction capacitance between N+ doped silicon layers and the P- doped silicon substrate. As a result of the decreased junction capacitance, the circuit operates faster.

Still referring to FIG. 2, it should be noted that for efficient circuit operation, the drive of IGFET Q2 should preferably be greater than or equal to that of IGFET Q1. When IGFET Q1 and IGFET Q2 are both conductive, current will flow from $V_{cc}$, through the fuse, to ground if the fuse element FE is unblown, and node A will not become charged. Consequently, output O through the first inverter I1 will be high. This high output is fed back to node A through the second inverter I2, thus latching the node in a low state. On the other hand, node A will become charged if the fuse is blown, and output O will be low. The output O is fed back to node A through the second inverter I2, thus latching node A in a high state. Once the latching of the node has occurred, whether in a low or high state, the first and second MOSFETs are rendered nonconductive, thus isolating the fuse from the node. The latched output is then used to select or deselect a feature option or redundant circuit element.

Figure 3:
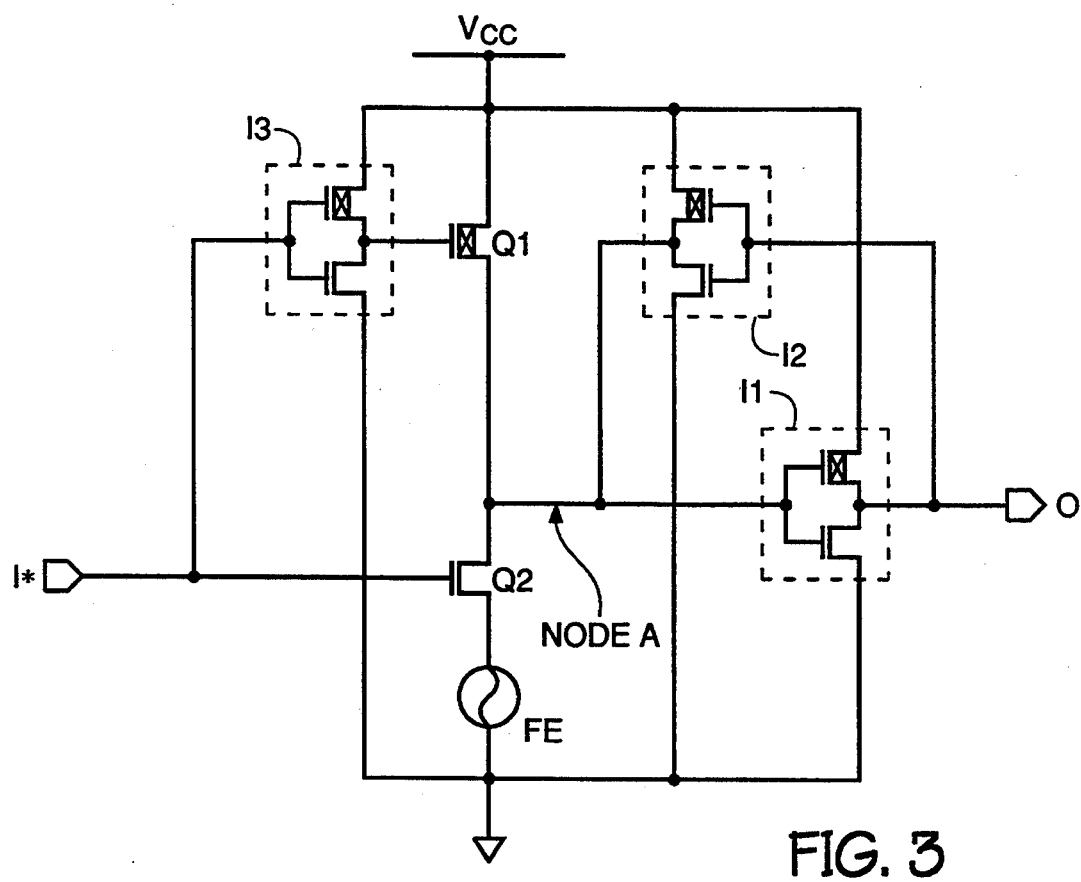
FIG. 3 is a complete circuit diagram of the first embodiment of the new, low-power fuse detect and latch circuit.

FIG. 3 is a circuit diagram of the abbreviated circuit shown in FIG. 2, expanded to fully depict the circuitry of the inverters. Referring to the circuit diagram of FIG. 3, it is easily understood how the latching of node A occurs through inverter I2. If output O is low, node A will be connected to $V_{cc}$ through inverter I2. Conversely, if output O is high, node A will be grounded through inverter I2.

Figure 4:
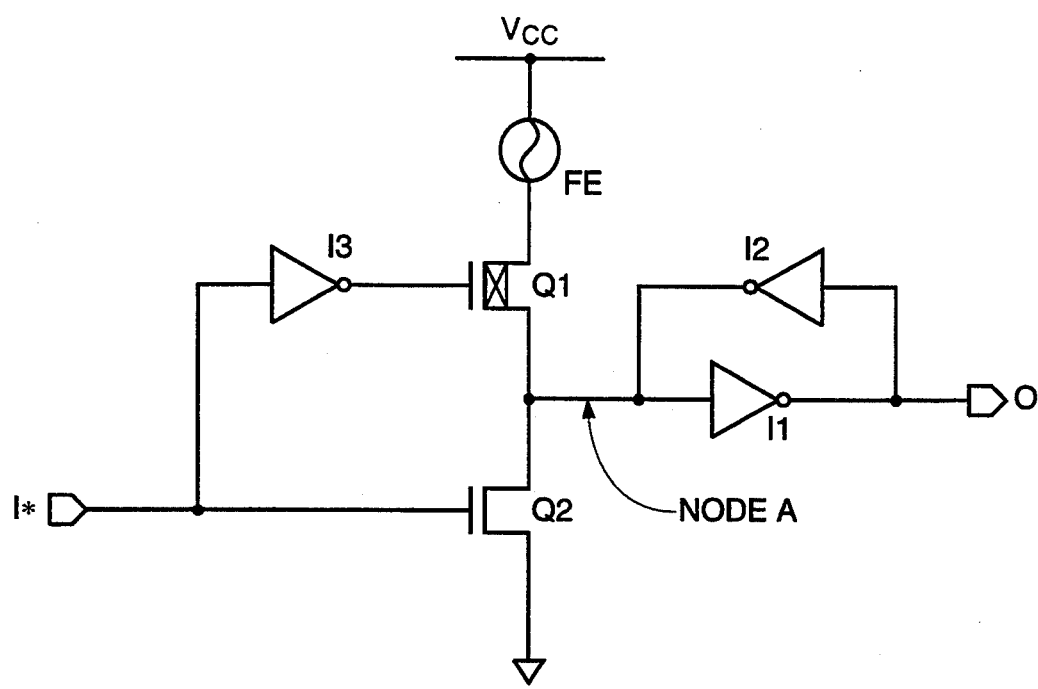
FIG. 4 is an abbreviated circuit diagram of a second embodiment of the new, low-power fuse detect and latch circuit.

Referring now to FIG. 4, which depicts a second embodiment of the low-power fuse detect and latch circuit, node A is coupled to a power supply voltage ($V_{cc}$) rail through a first insulated gate field effect transistor (IGFET) Q1 and fuse element FE, respectively, when fuse element FE is unblown, and to a ground rail through a second IGFET Q2. Although the circuit of FIG. 4 differs from that of FIG. 2 only with respect to the position of the fuse element FE (it shares the same input configuration for an active low input signal), the logical operation of the circuit is reversed, as hereinafter described.

Still referring to FIG. 4, it should be noted that for efficient circuit operation, the drive of IGFET Q1 should preferably be greater than or equal to that of IGFET Q2. When IGFET Q1 and IGFET Q2 are both conductive, although current will flow from $V_{cc}$, through the fuse element FE, to ground if the fuse element is unblown, and node A will become charged, as current flow through IGFET Q1 overwhelms current flow through IGFET Q2. Consequently, output O through the first inverter I1 will be low. This low output is fed back to node A through the second inverter I2, thus latching the node in a high state. On the other hand, node A will not become charged if the fuse is blown, and output O will be high. The output O is fed back to node A through the second inverter I2, thus latching node A in a low state. Once the latching of the node has occurred, whether in a low or high state, the first and second MOSFETs are rendered nonconductive, thus isolating the fuse element FE from the node. The latched output is then used to select or deselect a feature option or redundant circuit element.

For both first and second embodiments of the invention, first and second IGFETs must be gated "on" during a first portion of the power-up sequence by what shall be termed the "inactive" state of input signal I. During the inactive state, node A is coupled to both $V_{cc}$ and ground if the fuse element is unsevered. If signal I is high during the first, or inactive portion of the power-up sequence, and low during the second, or active portion of the power-up sequence, the signal to the gate of IGFET Q1 must be inverted. FIG. 2, having inverter I3 in the input path to the gate of IGFET Q1, is representative of the "active low" input case.

Figure 5:
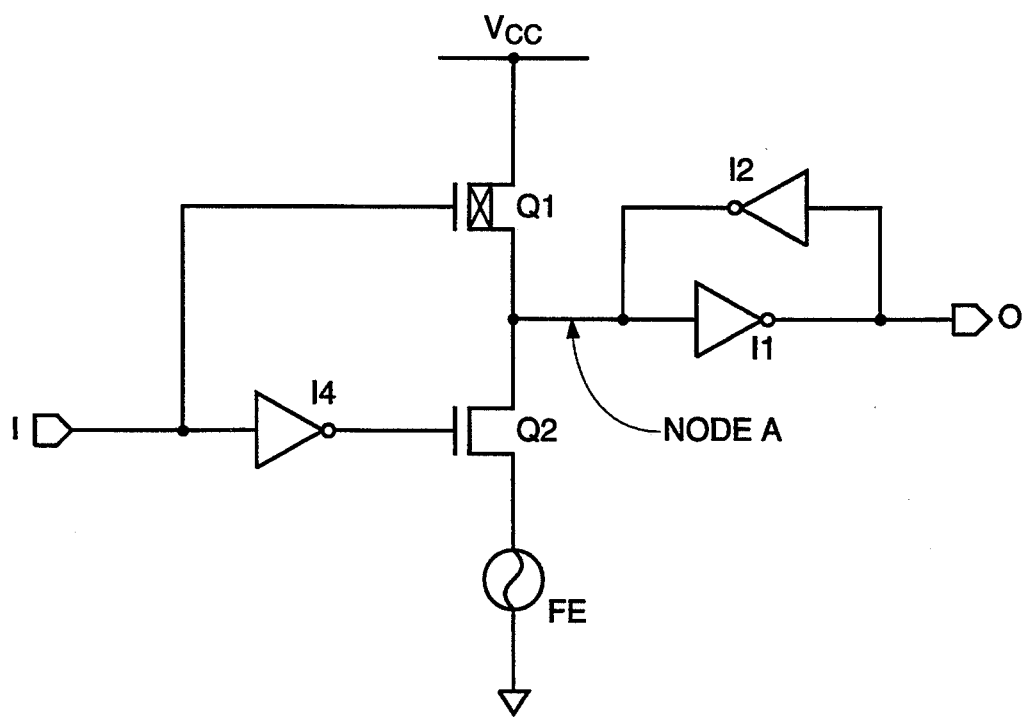
FIG. 5 is an abbreviated circuit diagram of a variation of the first embodiment of the new, low-power fuse detect and latch circuit.

Conversely, if signal I is low during the first portion of the power-up sequence, and high during the second portion thereof, the signal to the gate of IGFET Q2 must be inverted. FIG. 5 is a variation of the first embodiment of the invention of FIGS. 2 and 3 in which the fuse element FE is coupled between the ground and IGFET Q2. This first embodiment variation, which has inverter I4 in the input path to the gate of IGFET Q2, is representative of the "active high" input case.

Figure 6:
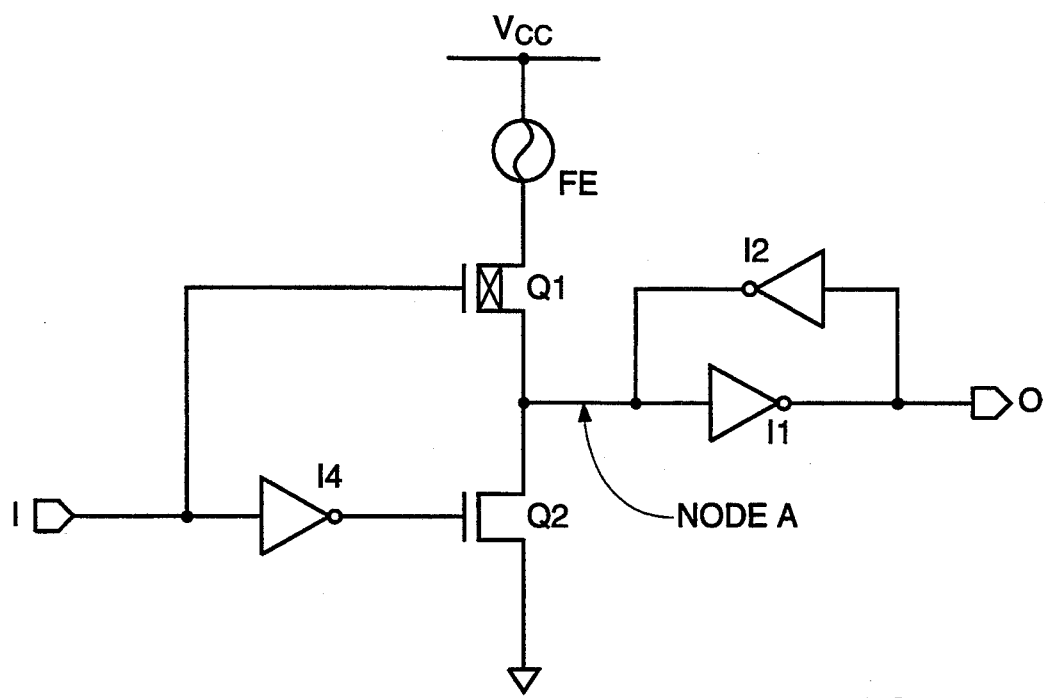
FIG. 6 is an abbreviated circuit diagram of a variation of the second embodiment of the new, low-power fuse detect and latch circuit.

FIG. 6 is a variation of the second embodiment of the invention of FIG. 4, in which the fuse element FE is coupled between the power supply voltage $V_{cc}$ and IGFET Q1. This second embodiment variation, which has inverter I4 in the input path to the gate of IGFET Q2 (as is also the case in the circuit of FIG. 5), is representative of the "active high" input case.

For both first and second embodiments of the invention, during a second portion of the power-up sequence, signal I becomes active (i.e., node A is isolated from $V_{cc}$ and from ground by IGFETs Q1 and Q2, respectively). The asterisk (*) associated with the input signal in FIG. 2 indicates that the input I is in an active state when low. Likewise, when I has no asterisk, as in FIG. 5, this indicates that input I is an active state when high.

The low-power circuit for detecting and latching the state of a fusible element is advantageous over the prior art in that a one time determination, regarding the blown or unblown status of a fuse, is made during the power-up sequence. During this power-up sequence, the fuse is isolated from the power supply voltage so that current can no longer flow through the fuse element, even if incompletely blown. This isolation continues until the part is powered down. Thus, transmigration has a very little opportunity to "heal" the fuse element. In addition, device instability during operation is eliminated, as the state of the fusible element is determined only at power-up. If the device is fully functional at power-up, it will remain so until the power to the device is cut.

Although only several embodiments of the low-power fuse detect and latch circuit have been shown and described, it will be readily apparent to those having ordinary skill in this art that the invention may be practiced in other, different embodiments, and that obvious modifications may be made to certain details, all without departing from the scope and spirit of the invention. Accordingly, the drawing and description are to be regarded as illustrative in nature, and not as restrictive. For example, an active high input signal may also be used with the circuit of FIG. 5 by utilizing the input configuration depicted in FIG. 4. In addition, although the invention is depicted and described herein in combination with a simple, twin inverter latch, other, generally more complex types of latch circuits are known in the art and can be substituted for the twin inverter latch. The invention, which may be described as an isolable fuse detect node having a latched output, should not be limited to a particular type of latch circuit.

What is claimed is:

1. A low-power circuit for detecting and latching the state of a fusible link, said circuit comprising:
   an input node;
   an output node;
   a fuse element which, at the time of circuit manufacture, provides a closed connection, but which can be selectively severed to provide an open connection;
   first and second transistors responsive to a digital input signal on said input node, said second transistor having a greater drive value than said first transistor;
   a fuse detect node which is coupled to said output node via a latch circuit, to power supply voltage through said first transistor, and to ground through said second transistor and said fuse element, respectively, when said fuse element is in an unsevered state.

2. The circuit of claim 1, wherein said digital input signal, when in a first state, causes said first and second transistors to be in a conductive state, and when in a second state, causes said first and second transistors to be in a nonconductive state.

3. The circuit of claim 2, wherein said first transistor is a P-channel field effect transistor, and said second transistor is an N-channel field effect transistor, each field effect transistor having an associated control gate.

4. The circuit of claim 3, wherein the first state of said input signal is a high logic level, the second state thereof is a low logic level, the gate of said second transistor is coupled to the input signal, and the gate of said first transistor is coupled to the complement of the input signal.

5. The circuit of claim 3, wherein the first state of said input signal is a low logic level, the second state thereof is a high logic level, the gate of said first transistor is coupled to the input signal, and the gate of said second transistor is coupled to the complement of the input signal.

6. The circuit of claim 1, wherein said latch circuit comprises:
   a first inverter having an input coupled to said fuse detect node and an output coupled to said output node; and
   a second inverter having an input coupled to said output node, and an output coupled to said fuse detect node.

7. The circuit of claim 2, wherein said input signal is in said first state during a first portion of a power-up sequence, and is in said second state during a second portion of said power-up sequence.

8. A low-power circuit for detecting and latching the state of a fusible link, said circuit comprising:
   an input node;
   an output node;
   a fuse element which, at the time of circuit manufacture, provides a closed connection, but which can be selectively severed to provide an open connection;
   first and second transistors responsive to a digital input signal on said input node, said first transistor having a greater drive value than said second transistor;
   a fuse detect node which is coupled to said output node via a latch circuit, to ground through said second transistor, and to power supply voltage through said first transistor and said fuse element, respectively, when said fuse element is unsevered.

9. The circuit of claim 8, wherein said digital input signal, when in a first state, causes said first and second transistors to be in a conductive state, and when in a second state, causes said first and second transistors to be in a nonconductive state.

10. The circuit of claim 9, wherein said first transistor is a P-channel field effect transistor, and said second transistor is an N-channel field effect transistor, each field effect transistor having an associated control gate.

11. The circuit of claim 10, wherein the first state of said input signal is a high logic level, the second state thereof is a low logic level, the gate of said second transistor is coupled to the input signal, and the gate of said first transistor is coupled to the complement of the input signal.

12. The circuit of claim 10, wherein the first state of said input signal is a low logic level, the second state thereof is a high logic level, the gate of said first transistor is coupled to the input signal, and the gate of said second transistor is coupled to the complement of the input signal.

13. The circuit of claim 8, wherein said latch circuit comprises:
- a first inverter having an input coupled to said fuse detect node and an output coupled to said output node; and
- a second inverter having an input coupled to said output node, and an output coupled to said fuse detect node.

14. The circuit of claim 9, wherein said input signal is in said first state during a first portion of a power-up sequence, and is in said second state during a second portion of said power-up sequence.

15. A low-power circuit for detecting and latching the state of a fusible link, said circuit comprising:
- an input node;
- an output node;
- a fuse detect node which is coupled to said output node via a latch circuit;
- a fuse element which, at the time of circuit manufacture, provides a closed connection, but which can be selectively severed with a pulse of coherent electromagnetic energy to provide an open connection;
- first and second transistors responsive to a digital input signal on said input node;
- said first transistor coupling said fuse detect node to a power supply rail, and said second transistor coupling said fuse detect node to a ground rail, when said fuse element is unsevered;
- said first transistor, thereby being associated with said power supply rail; and said second transistor thereby being associated with said ground rail;
- said fuse element being interposed between one of said rails and the transistor associated with that one rail;
- said first transistor having a greater drive value than said second transistor when said fuse element is interposed between the power supply rail and said first transistor, but having a smaller drive value than said second transistor when said fuse element is interposed between the ground rail and said second transistor.

16. The circuit of claim 15, wherein said digital input signal, when in a first state, causes said first and second transistors to be in a conductive state, and when in a second state, causes said first and second transistors to be in a nonconductive state.

17. The circuit of claim 16, wherein said first transistor is a P-channel field effect transistor, and said second transistor is an N-channel field effect transistor, each field effect transistor having an associated control gate.

18. The circuit of claim 17, wherein the first state of said input signal is a high logic level, the second state thereof is a low logic level, the gate of said second transistor is coupled to the input signal, and the gate of said first transistor is coupled to the complement of the input signal.

19. The circuit of claim 17, wherein the first state of said input signal is a low logic level, the second state thereof is a high logic level, the gate of said first transistor is coupled to the input signal, and the gate of said second transistor is coupled to the complement of the input signal.

20. The circuit of claim 15, wherein said latch circuit comprises:
- a first inverter having an input coupled to said fuse detect node and an output coupled to said output node; and
- a second inverter having an input coupled to said output node, and an output coupled to said fuse detect node.

* * * * *